United States Patent [19]
Nishiyama

[11] Patent Number: 5,610,395
[45] Date of Patent: Mar. 11, 1997

[54] PHOTODETECTOR MODULE WITH A PHOTODIODE ELECTRICALLY CONNECTED DIRECTLY ON TOP OF A PARALLEL PLATE CAPACITOR

[75] Inventor: Naoki Nishiyama, Osaka, Japan

[73] Assignee: Sumitomo Electric Industries, Ltd., Osaka, Japan

[21] Appl. No.: 439,669

[22] Filed: May 15, 1995

[30] Foreign Application Priority Data

May 16, 1994 [JP] Japan .................................. 6-126973

[51] Int. Cl.$^6$ ..................................................... H01L 31/02
[52] U.S. Cl. .................. 250/239; 250/214 A; 250/214.1; 361/728; 257/433
[58] Field of Search ............................. 250/239, 227.11, 250/214.1, 214 A, 214 R; 359/299; 315/158; 361/728; 257/433

[56] References Cited

U.S. PATENT DOCUMENTS

| | | | |
|---|---|---|---|
| 4,103,157 | 7/1978 | Green | 250/239 |
| 4,758,767 | 7/1988 | Blake | 315/158 |
| 5,132,532 | 7/1992 | Watanabe | 250/239 |

OTHER PUBLICATIONS

Horigome et al, "Pre–Amp Containing PD Module", 1990 Spring Conference of Electronics Information and Communication Society, vol. 4, C–271, Mar. 5, 1990, pp. 4–326.
Sawai et al, "Pre–Amp Containing PD Module", 1993 Spring Conference of Electronics Information Communication Society, vol. 4, C–186, Mar. 15, 1993, pp. 4–222.

*Primary Examiner*—Stephone Allen
*Attorney, Agent, or Firm*—Cushman Darby & Cushman, IP Group of Pillsbury Madison & Sutro, LLP

[57] ABSTRACT

A photodetector module contains a package, a photodiode, a preamplifier, a bypass capacitor, a cap with a lens and a sleeve. A parallel plate capacitor is used as the bypass capacitor. The parallel plate capacitor is mounted at the center of the package. The photodiode is stuck on the parallel plate capacitor. Since the photodiode is piled upon the capacitor, the module curtails the area for mounting a capacitor. The fiber, the lens, the photodiode and the capcitor align along a central line with rotational symmetry. The two-story structure reduces the size of the module and the cost of production by decreasing the number of the parts and the steps of production.

5 Claims, 10 Drawing Sheets

φ 10 mm × 14 mm
InGaAs—PIN PD

InGaAs—PIN PD
φ 7 mm × 24 mm

FREQUENCY PERFORMANCE

SnPb melting point 240°C
AuSn melting point 286°C

PHOTODETECTOR MODULE WITH A PHOTODIODE ELECTRICALLY CONNECTED DIRECTLY ON TOP OF A PARALLEL PLATE CAPACITOR

BACKGROUND OF THE INVENTION

1. Field of Invention

This invention relates to a photodetector module which is utilized in optoelectronic communication systems and a method of making the photodetector module. The photodetector module is a device which receives optical signals propagating in an optical fiber and converts the optical signals into electric signals. A photodetector module is produced by mounting a photodiode chip, a preamplifier chip and a capacitor on a package, sealing the package with a cap having a window and sticking a sleeve above the cap to the package. The sleeve is a cylindrical receptacle in which an end of an optical fiber will be inserted. A lens is often fitted on the window of the cap In order to converge the light beams emitted from the end of an optical fiber on the photodiode chip. The device is called a "photodetector" module, because the device has a photodiode which converts optical signals to electric signals and a preamplifier for amplifying the electric signals in the same package.

2. Description of Related Art

This application claims a priority based on Japanese Patent Application No. 126973/1994 filed 16 May, 1994. Prior photodetecting device was usually built of a package and a photodiode chip mounted on the package. Optical signals are converted to electric signals by the photodiode and are output from the device. The electric signals are amplified by a preamplifier which is furnished on a print circuit plate out of the photodetecting device. The outer-installed preamplifier, however, cannot prevent external noise from mixing with a weak signal, since a weak signal propagates in a long, narrow wire. In the case of a high frequency signal, the self-induction L of the long wire deforms the electric signal. Contrivance which furnishes a photodiode and a preamplifier on close positions in the same package has been suggested in order to suppress the bad influence of the external noise. For example, the following module was proposed;

① NOBUYOSHI HORIGOME, KAORU MORIYA, IWAO ODA, EIJI KIKUCHI & SEISHI CHIBA, "Pre-Amp containing PD module", 1990 Spring Conference of Electronics Information and Communication Society, the 4th volume, C271, p4–326 ( FIG. 3 of this application shows the structure of the PD module)

The proposed PD module has a stem (30), a plate (34) fixed on the stem (30), a photodiode and a preamplifier which are mounted together on the plate (34). A cap (31) is positioned and is welded on the stem (30) by a laser. A lens (32) has been fitted in an opening of the cap (31). A receptacle (33) is also positioned and is welded on the front end of the cap (31). The photodiode is an InGaAs-PIN photodiode. The preamplifier is a Si bipolar transistor type amplifier. The PD module adopts an optical fiber with a core of a 50 μm diameter and a cladding of a 125 μm diameter. This module has a diameter of 10 mm and a length of 14 mm. The report writes that the −3 dB attenuating frequency is 200 MHz. The author describes that the device obtained a flat frequency performance without peaking and the necessary properties for an optical network of a 100 Mbit/sec band. The device has a photodiode and a preamplifier mounted on a print plate. The electrode pads and patterns are connected by bonding wires between them. The purpose of the PD module is to enhance the speed of response and reliability of the device by assembling the preamplifier in the package together with the photodiode.

① YOSIKAZU SAWAI, KAORU MORIYA, MASAHIKO HIRAO & HIROO KITASAGAMI, "Pre-Amp containing PD module", 1993 Spring Conference of Electronics Information Communication Society, 4 band, C-186, p4–222 (FIG. 4 shows the device).

The device is produced by mounting a photodiode and a preamplifier on a plate (44) fixed on a stem (40), positioning a cap (41) having a lens and fixing the cap (41) on the stem (40). The device has a receptacle (holder) on the cap (41). An end of a fiber assembly (42) is inserted into the receptacle. A nut prevents the fiber end from being plucking out of the receptacle. The preamplifier is a Si bipolar transistor type. The photodetector is an InGaAs-PIN photodiode with a light-receiving region of an 80 μm diameter. In the case of making a device of high sensitivity, the device is built with a GaAs-FET preamplifier and an InGaAs-PIN photodiode with a light-receiving region of a 50 μm diameter. The optical fiber is a single-mode fiber with a core of a 10 μm diameter and a cladding of a 125 m outer diameter. The module has a 7 mm diameter except for the flange and a 24 mm length.

These improvements try to cut the noise commonly by mounting a photodiode and a preamplifier together in a package and shortening signal propagating wires. These photodiode modules use a special IC (integrated circuit) for the preamplifier of the signal of the photodiode. FIG. 3 and FIG. 4 do not clearly depict the way of mounting the preamplifier and the photodiode on the package. Thus, two examples will be described for clarifying the way of mounting the photodiode and the preamplifier.

PRIOR EXAMPLE ①

FIG. 5 is a perspective view of a prior photodiode module. FIG. 8 is a plan view of the package. The package (1) is a general-use package on sale. A photodiode (3) and a preamplifier IC (4) are mounted on a print plate (15). A source (power supply) pattern (16) and a ground pattern (17) are formed on the print plate (15). A wire connects the source (power supply) pattern (16) with a source pin (11). A ring electrode on the photodiode (3) is joined to an input terminal of the preamplifier IC (4) with a wire. The ground pattern (17) is jointed to the package by another wire.

A chip capacitor (18) bridges the source pattern (16) and the ground pattern (17). The ends of the capacitor are soldered on both the source pattern (16) and the ground pattern (17). The photodiode is fixed at the center of the upper surface of the package. The preamplifier (4) and the chip capacitor (18) are fixed on reverse sides with regard to the photodiode chip (3) on the package. The amplified signal from the preamplifier (4) is taken out from an output pin (12) of the package.

A cap (7) with a lens (6) covers the upper surface of the package (1). The light-receiving region of the photodiode is aligned in a central axial line of the lens. Then the cap (7) is welded by a laser at the adjusted position of the package. Furthermore, a sleeve (8) for fitting a ferrule is positioned and welded by a laser on the package outside of the cap (7). A ferrule holding an end of an optical fiber is inserted and fixed in the sleeve (8).

PRIOR EXAMPLE ②

FIG. 6 is a perspective section of another prior photodiode module. The module forms a special patterns (19) and (20)

on the upper surface (5) of the package (1). The ground pattern (19) is made from a rectangular metal pattern which is connected to a case pin (10) below. The source pattern (20) is bow-shaped metal pattern which is connected to a source pin (11) below. The package (1) has a metal disc part, three pins (10), (11), (12) and an insulator (13) which maintains the pins to the disc part, and electrically separates these pins from the disc. The insulator (13) is denoted by dots in FIG. 6. The insulator (13) has the role of unifying these parts and sealing the inner space of the package. The prior module used special pins and a single-purposed package which had been made only for this device.

The photodiode (3) and the preamplifier (4) are mounted on the central ground pattern (19) which connects with the case pin (10). The bottom surface of the photodiode is a cathode of the diode. Thus, the bottom surface must electrically be isolated from the ground pattern (19) below. For the purpose of isolating the photodiode chip, an insulating spacer (9) is stuck to the ground pattern (19). The photodiode chip (3) is furnished on the insulating spacer (9). The source pattern (20) is connected by a wire to the upper metal-coated surface of the insulating spacer. Another wire joins the source pattern (20) to an electrode pad of the preamplifier IC (4).

Prior modules of example 1 and example 2 accomplish such a circuit designated by FIG. 9. In the circuit, electrodes of a capacitor (2) or (18) are connected to the source pin (11) and to the ground pin (10). The source pad of the preamplifier is jointed by the wire (22) to the source pin (11). The ground pad of the preamplifier is connected by the wire (24) to the case pin (ground pin) (10). The output of the preamplifier (4) is joined to the signal output pin (12). The cathode of the photodiode (3) communicates with the source. The anode of the photodiode (3) is connected to the preamplifier IC (4).

In the module of FIG. 5 and FIG. 8, the source line (16) corresponds to the pattern (16) and the ground line (17) corresponds to the pattern (17). In the module of FIG. 6, the source line is the source pattern (20) and the ground line is the ground pattern (19).

A conventional photodiode module mounts a photodiode and a preamplifier close together in a package. Furthermore, a capacitor is inserted between the source voltage and the ground voltage of the photodiode and the preamplifier for stabilizing the performance of the photodiode module. The capacitor reduces the AC resistance of the power source and prevents the noise riding on the source line from entering the device by forming a noise filter in the source. Of course, the power source which is connected by the pins to the device is accompanied by a capacitor of a big capacitance. The external, big capacitance also decreases the impedance of the power source. An AC resistance, however, arises in the source line due to the self-induction L of the pins and the wires, which raises the impedance substantially. Prevention of the rise of the AC impedance requires an insertion of another capacitor at a point quite close to the preamplifier and the photodiode. Prior modules have installed a capacitor in the package for the reason. The capacitor plays the role of the filter of abating the AC resistance of the source line, eliminating the ripple of the voltage and removing the noise. Conventional photodiode modules have the following structures as mentioned till now;

Structure ①

A small print plate (15) on which a capacitor, a photodiode and a preamplifier are furnished together is fixed on a package (FIG. 5).

Structure ②

A special package having the patterns (19) and (20) on which a capacitor, a photodiode and a preamplifier are upholstered together is used (FIG. 6).

These prior structures still suffer from some difficulties. The additional use of a print plate complicates the steps of mounting parts on the package in structure ①. The use of the special package having complex patterns (19) and (20) raises the cost of production. Besides, the horizontal disposition of the capacitor and the photodiode demands a wide area for mounting, which enlarges the package. In particular, the capacitor has a broader size than the photodiode or the amplifier in general. Both structures ① and ② fail to construct a small-sized photodetector module which can be produced by simple steps.

A purpose of the present invention is to provide a small-sized photodetector module. Another purpose of the present invention is to provide a photodetector module which can be produced by facile steps. Another purpose of the present invention is to provide a photodetector module which can be produced with low cost.

SUMMARY OF THE INVENTION

These difficulties can be eliminated by disposing the bypass capacitor in a pertinent position which is used as a filter for reducing the AC resistance of the power source, eliminating the ripple of the voltage and getting rid of the noise.

The photodetector module of the present invention is characterized by an adoption of a parallel plate capacitor which has two parallel electrodes sandwiching a dielectric medium. The photodiode module is produced by fitting a parallel plate capacitor at the center of a package and sticking a photodiode on the parallel plate capacitor. The upper surface of the parallel plate capacitor is allotted to the source pattern for the photodiode. Since the photodiode is piled on the parallel plate capacitor, the device can save the area for mounting the capacitor. This invention is characterized by the three-dimensional structure of heaping the photodiode on the capacitor. The parallel plate capacitor is a new type of capacitor which has a flat dielectric medium and two parallel electrodes which sandwich the flat dielectric medium. Inherently the bottom (cathode) of a photodiode should be connected to the power source, as shown in FIG. 9. The structure of the photodiode enables the device to ride the photodiode directly on the top surface of the parallel plate capacitor which shall be the source pattern for the diode.

This invention fixes the parallel plate capacitor on a package and mounts the photodiode on the parallel plate capacitor. The two-story structure of the capacitor and the photodiode features this invention. The two-story structure is novel. The structure enables the module to reduce the mounting area of the package. The reduction of the necessary area can miniaturize the module. The elimination of the special-purposed plate of FIG. 5 and the spacer of FIG. 6 simplifies the steps of production. This invention can realize a small, inexpensive and high-performance photodetector module.

DETAILED DESCRIPTION OF THE PREFERRED EMBODIMENTS

Figure 1:
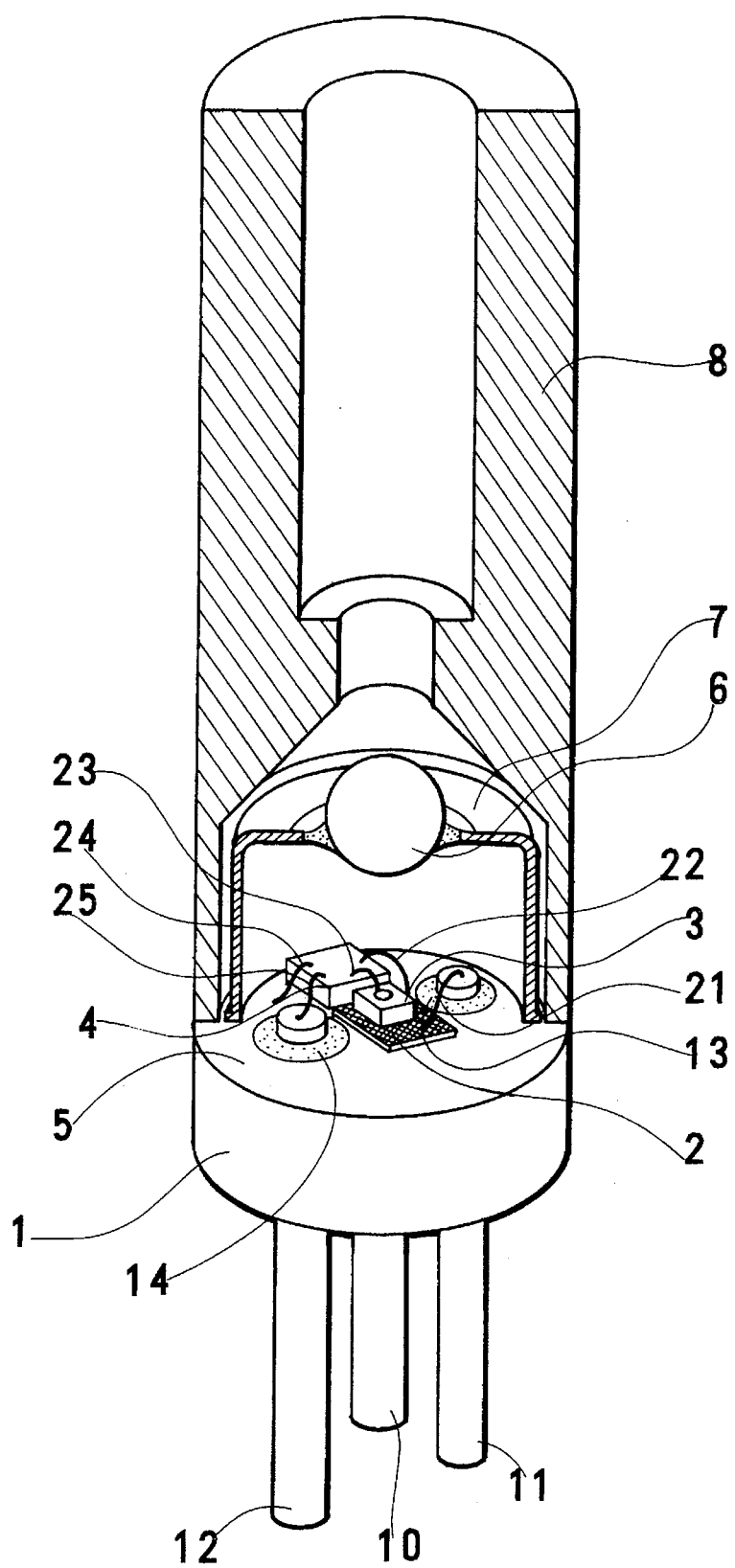
FIG. 1 is a perspective view of a vertical section of a photodiode module of a first embodiment of the present invention.

This invention bonds a parallel plate capacitor at a center of a package and fits a photodiode on the capacitor. The structure can be called a two-story structure briefly. The two-story structure saves the area for placing a capacitor and dispenses with a wire which connects the capacitor to the source pattern and another wire which couples the capacitor to the ground pattern. The saving of the area enables this invention to miniaturize the module. The reduction of the parts simplifies the steps of fabricating the module and reduces the cost of production.

The most important matter of this invention is the use of the parallel plate capacitor. The use of the parallel plate capacitor allows the photodiode to ride on the capacitor. Other type of capacitor forbids another device from riding on it. Thus the fiber, the lens, the photodiode and the capacitor align along a central line with rotational symmetry. Nobody has tried to mount an electric part on another electric part as yet. It contradicts the common sense of the skilled to pile a part upon another part. Electric or electronic parts are used to be arranged in two dimensional relations either on a print circuit plate or on a package.

What enables this invention to dispose the parts in three dimensional relation is the parallel plate capacitor which is a novel type of capacitor.

Therefore, it may be desirable to explain the parallel plate capacitor at first. Many different kinds (paper capacitor, film capacitor, electrolytic capacitor, mica capacitor, ceramic capacitor etc.) of capacitors have been produced and used in accordance with the differences of the capacitance or the withstanding voltage. Capacitors with a small capacitance of pico Farads (pF) are usually made from a dielectric of oxides of titanium (Ti) or tantalum (Ta). Mica capacitors cover the capacitance region from pF to micro Farads (μF). Electrolytic capacitors with a big capacitance are used for stabilizing the power source. The capacitor winds a strip having a dielectric and metal sheets sandwiching the dielectric in many turns for increasing the capacitance.

In addition to the classification by the withstanding voltage and the capacitance, capacitors can be sorted by the connecting parts. Most popular capacitors have two parallel pins for connecting them to external devices. The pin type capacitor is fixed to a print circuit plate having copper plating patterns on the bottom surface by boring holes, inserting the pins to some pertinent holes, soldering the pins to the Cu print patterns and cutting extra length of the pins. Chip capacitors are used in hybrid integrated circuits (IC). The chip capacitor is a rectangular solid having flat electrodes on both ends instead of pins. The chip capacitor Is fixed to a print plate with Cu patterns coated with a solder of a hybrid IC by positioning the chip capacitor at a suitable spot, carrying the print plate in a reflow furnace, melting the solder and soldering the side electrodes to the Cu patterns. The pin type capacitors and the chip type capacitors have been used since a long time before.

A capacitor is a device which sandwiches a dielectric film by two metal sheets in principle. Usual textbooks of electronics depict a schematic view of a capacitor which has a dielectric medium and two electrodes holding the dielectric between them. The simplified figures used to show two parallel electrodes and a flat dielectric medium maintained therebetween. The parallel electrodes and a flat dielectric medium are a simplified concept of a capacitor. A parallel plate capacitor, however, has not been used since long before, because such a capacitor could not be produced yet owing to the difficulty of making a very thin dielectric film without a leak current. The capacitance C is in proportion to the area S of the dielectric and the dielectric constant $\varepsilon$, but in reverse proportion to the thickness d of the dielectric. Namely, $C = \varepsilon S/d$. Prior capacitors used to wind or fold a sheet of a dielectric sandwiched by conductors and insulators in many turns in order to raise the total capacitance by enhancing the effective area S of the dielectric medium. Pin type capacitors or chip type capacitors are not built simply with parallel electrodes and a flat dielectric medium.

Recent development of thin film technology enables to make a quite thin film without holes and to produce new parallel electrode capacitors in which parallel flat electrodes sandwich a flat dielectric medium.

For example, Dielectric Laboratories Inc., in U.S.A. produces and sales parallel plate capacitors with the trademark of "di-cap". The capacitor is built by sandwiching a ceramic dielectric by Au layers. The Au layers are electrodes. The reason why the electrodes are made of gold is that gold layers enable the capacitor to be directly soldered to copper patterns. The capacitor is a thin rectangular parallelepiped having electrodes on both surfaces. Thus, the capacitor can be directly ridden on a microstrip line and be soldered on the line. The use of the di-cap allows the microstrip line to reduce the self induction L and to prohibit the reflection of signals at the capacitor by equalizing the width of the capacitor to the width of the line.

Low resistance metal layers are directly in contact with the dielectric layer. The capacitor need not use narrow wires for jointing the capacitor to an external device unlike other types of capacitors. The self-induction L of the connection lines is small enough. Thus the capacitors are suitable for high frequency circuits which are suitable for the treatment as a distributed parameter circuit.

The width W of the "di-cap" ranges from 0.254 mm to 2.286 mm. The length L ranges from 0.254 mm to 2.540 mm. The thickness T is from 0.102 mm to 0.254 mm. The withstanding voltage of the "di-cap" is 50 V or 100 V. No capacitor with other withstanding voltage has not been sold yet. The di-cap of a 100 V withstanding voltage has a 1.5 times bigger thickness than the di-cap of a 50 V withstanding voltage. The capacitance of the parallel plate capacitors ranges from 68 pF to 1500 pF. The DC resistance is more than 106 MDΩ.

For example, a di-cap of 68 pF with a 50 V withstanding voltage has a width W=0.254 mm, a length L=0.254 mm and a thickness T=0.102 mm. Another di-cap of 470 pF with a 50 V withstanding voltage has W=0.635 mm, L=0.762 mm and T=0.102 mm Since the thickness of the dielectric is restricted within a narrow scope, the size differs according to the difference of the capacitance. The area WL is in proportion to the capacitance C.

Figure 11:
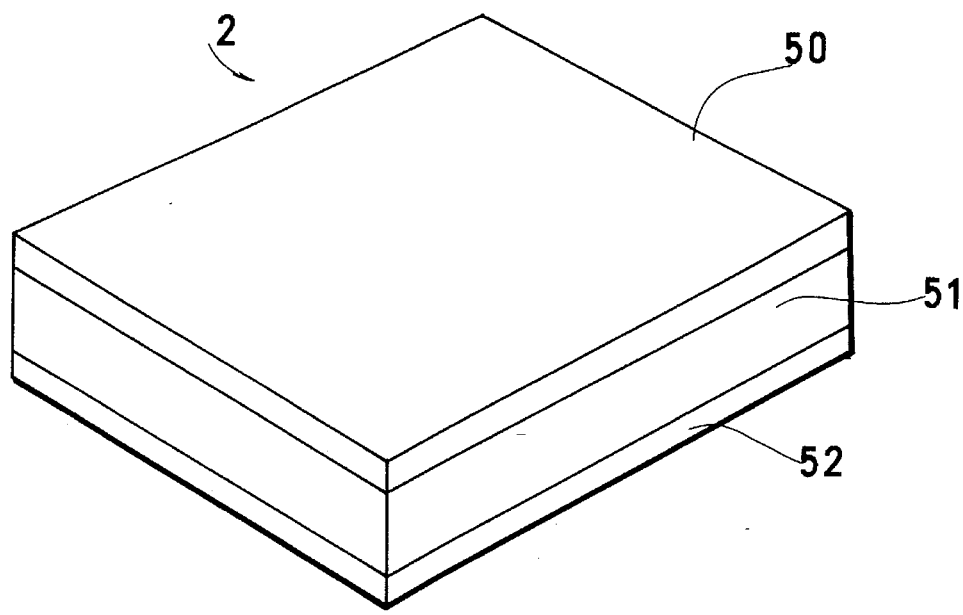
FIG. 11 is a perspective view of a parallel plate capacitor.

FIG. 11 shows a parallel plate capacitor (2) which has a simple structure having a metal (50), a dielectric (51) and a metal (52) which are piled in this order. This capacitor is entirely different in the shape and in the mode of connection with other circuit from the pin-type capacitors or the chip capacitors.

Figure 12:
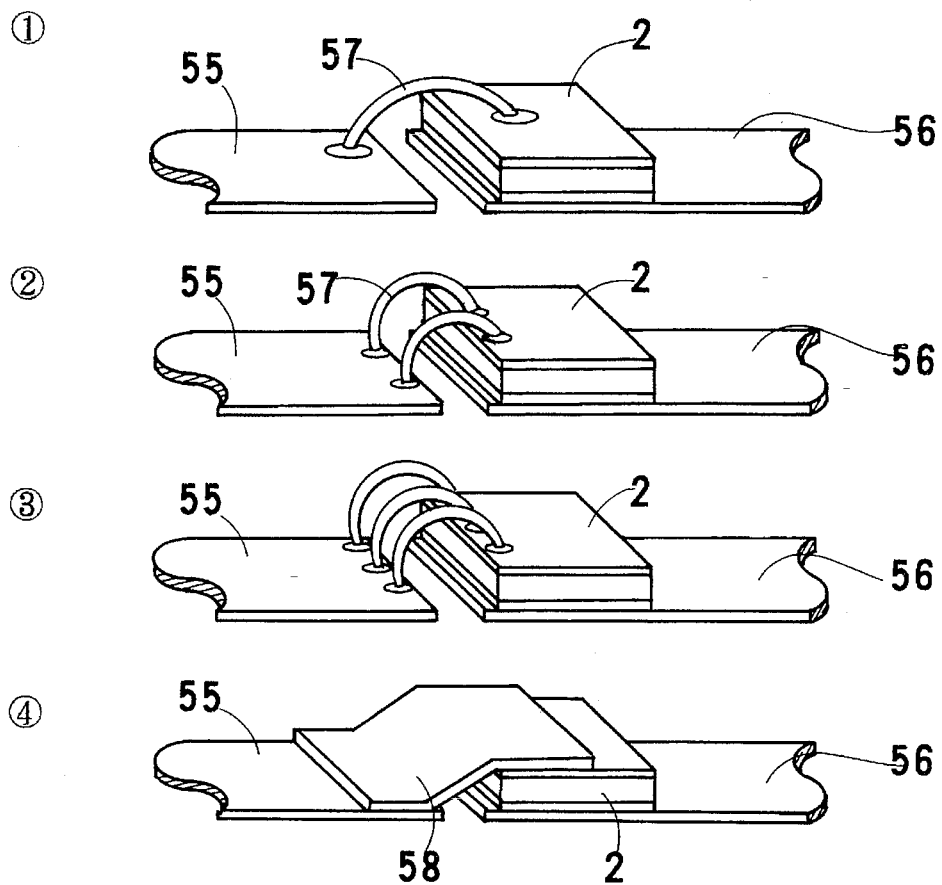
FIG. 12 is perspective views of four examples of the parallel plate capacitor which is interposed between two microstrip lines.

FIG. 12 demonstrates four examples of the modes of connection in which a capacitor (2) is jointed between two metal patterns (55) and (56) which are microstrip lines.

Mode ① solders a parallel plate capacitor (2) at an end of a metal pattern (56) with a width equal to the width of the capacitor (2). The whole of the bottom surface of the capacitor (2) is joined to the pattern (56). The upper surface is connected by a wire (57) to an end of another pattern (55).

Mode ② also fits a di-cap on an end of the microstrip line (56) with a solder. The upper surface of the capacitor (2) is connected by two wires to another metal pattern (55). The use of two wires reduces the resistance and the self-induction of the joints.

Mode ③ connects the upper surface of the capacitor (2) with three wires to another metal pattern (55). The adoption of three wires further reduces the resistance and the self-induction.

Mode ④ couples the upper surface of the capacitor (2) to another metal pattern (55) by a wide thin metal plate (58).

The use of plural wires prevents the delay, the deformation and the reflection of signals by decreasing the AC resistance R and the induction L of the line. Mode ④ is the best mode of connection owing to the minimum L and l.

Figure 13:
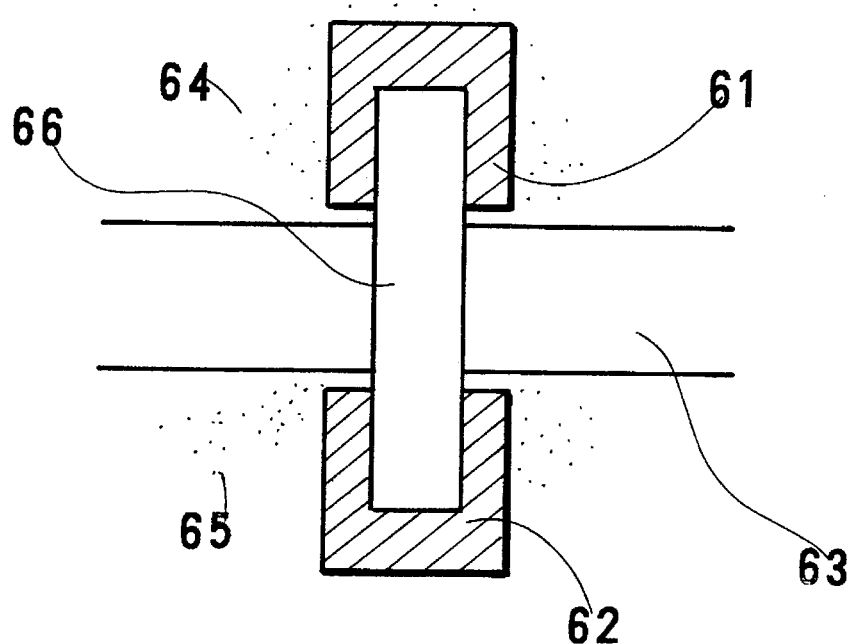
FIG. 13 is a plan view of two parallel plate capacitors interposed between two ground surfaces and a metal pattern.

FIG. 13 denotes another mode of connection between the capacitors and patterns. A bonding stripe (66) is employed in the mode for inserting two parallel plate capacitors (61) and (62) between a microstrip line (63) and the ground patterns (64) and (65). The bottom surfaces of the capacitors (61) and (62) are overall stuck to the ground patterns (64) and (65). The upper surfaces of the capacitors (61) and (62) are connected by the bonding stripe (66) to the middle microstrip line (63). The whole of the bottom is entirely glued to the ground pattern. The upper surface is connected by the wide bonding stripe (66). The mode of connection can minimize the self-induction L of the connection lines.

The examples clarify the fact that the parallel plate capacitors have wide electrodes which enables the capacitor to be soldered to metal patterns overall. The parallel plate capacitor is suitable for a high frequency circuit, because it can reduce the AC resistance of the connection lines.

Figure 14:
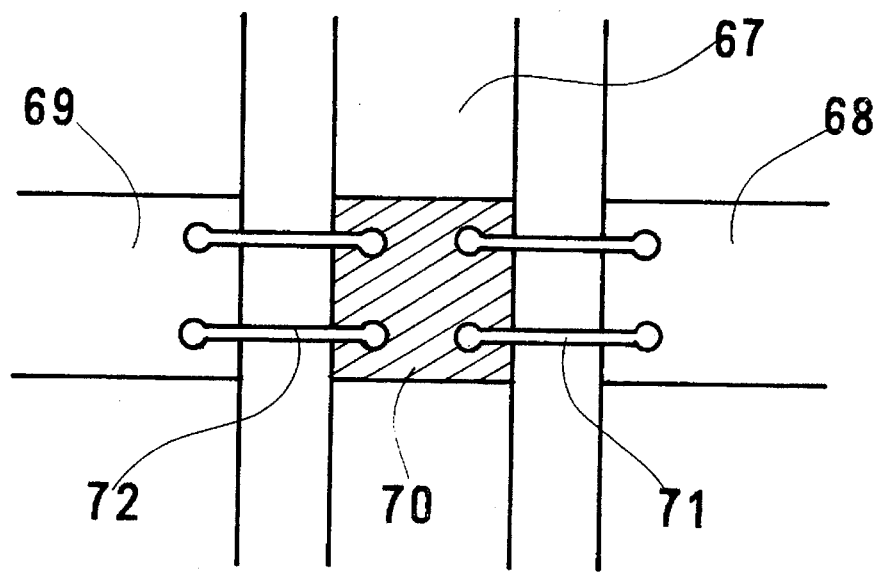
FIG. 14 is a plan view of three metal patterns and a parallel plate capacitor connected to the patterns.

Other mode of connection is shown in FIG. 14. This mode connects a capacitor (70) to two source patterns (68) and (69) and a ground line (67). The whole of the bottom of the capacitor (70) is soldered on the ground pattern (67). The upper surface is joined to a source pattern (68) by a pair of wires (71). The same surface is jointed to a different source pattern (69) by another pair of wires (72).

Parallel plate capacitors are novel, small-seized capacitors which are preferably used between a source level and a ground level for eliminating the noise riding on the source line. In any cases, the bottom surface Is soldered to a pattern and the upper surface is connected to another pattern by wires or a stripe. These are the modes of mounting of parallel plate capacitors. There is no other mode of connection yet. Nobody has tried another mode of mounting than the modes of FIG. 12, FIG. 13 and FIG. 14. Thus, nobody has found a mode of placing another device on the capacitor like this invention. This invention is novel also with regard to the connection mode of the capacitor itself In addition to the novelty of the structure of a PD module.

Then this invention is explained more in detail by preferred embodiments.

EMBODIMENT

Photodetector module of this invention succeeds in saying the necessary area of the package, reducing the number of parts and decreasing the steps of production by piling a photodiode on a parallel plate capacitor.

An embodiment will be explained by referring to figures. FIG. 1 is a perspective view of a vertical section of the photodiode module as an embodiment of the present invention. This embodiment adopts a general-use three pin package (1) of a 5.6 mm diameter. This is a commonplace package which has been used for a package of various kinds of transistors.

The package has three pins (10), (11) and (12). One pin is a case pin (10) which is connected to the package itself. Another pin is a source pin (11). The last one is a signal output pin (12) which transmits the signal of the preamplifier to an external circuit. The case pin (10) is soldered to the package (1). Upper ends of the source pin (11) and the signal output pin (12) project over the upper surface (5) of the package (1). There are insulators (13) and (14) among the package (1), the source pin (11) and the signal output pin (12). The insulators mechanically hold the pins (11) and (12) to the package (1), separating electrically the pins from the package (1).

A parallel plate capacitor (2) of a capacitance of 470 pF is fixed on the package (1) with an AuSn (gold/tin) solder. The size of the rectangular capacitor (2) is 0.9 mm×1.0 mm×0.1 mm. The parallel plate capacitor (2) has electrodes on the top surface and the bottom surface (0.9 mm×1.0 mm). The bottom surface is glued directly with the AuSn solder to the package which is at the ground level. The AuSn solder has a melting point of 286° C. The upper surface of the parallel plate capacitor is another electrode.

A photodiode (3) is positioned for harmonizing it with the center of the package and is fixed on the parallel plate capacitor (2) with a SnPb solder. The melting point of the SnPb (tin/lead) solder is 240° C. The difference of the melting points of the solders is important for making the structure of FIG. 1. The solder which glues the bottom surface of the capacitor (2) the upper face of the package (1) is called the first solder. The melting point of the first solder is denoted by Tc1. The solder which connects the bottom of the photodiode chip to the top of the capacitor (2) is called the second solder. The melting point is Tc2.

After the capacitor (2) has been stuck by the first solder to the package (1), the photodiode (3) is glued by the second solder to the top of the capacitor (2). The order of the soldering requires an inequality of Tc1>Tc2. Otherwise, when the second solder is melted, the once-solidified first solder is also melted and the parallel plate capacitor is liable to displace from the normal position.

The desirable difference (Tc1−Tc2) of the melting points Tc1 and Tc2 is more than 20° C. The above example satisfies the condition, because Tc1=286° C., Tc2=240° C., and Tc1−Tc2=46° C. There are other probable sets of solders except the sets of AuSn and SnPb of the example.

Figure 16:
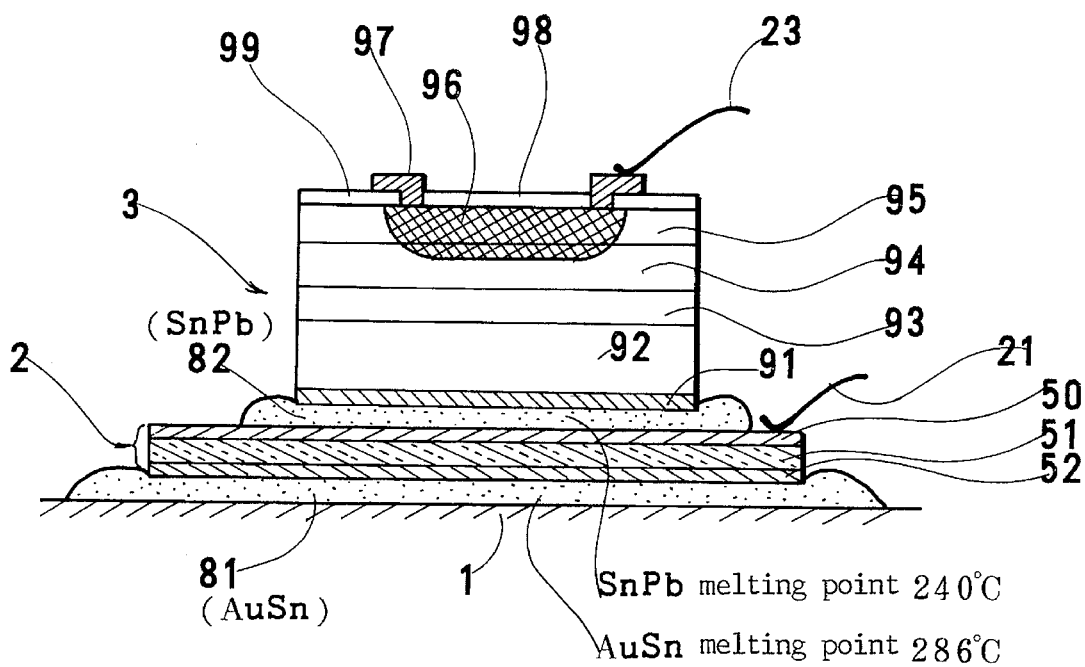
FIG. 16 is a sectional view of the mount of the photodiode module of the present invention which mounts a parallel plate capacitor on the package with a solder and fixes a photodiode chip on the capacitor with another solder.

FIG. 16 exhibits the section of the mount of a parallel plate capacitor (2) and a photodiode (3) on a package. A parallel plate capacitor (2) is stuck on a package (1) with an AuSn solder (81). Since the parallel plate capacitor has a complete metal layer (52) on the bottom, the whole of the bottom of the capacitor (2) is soldered to the upper surface of the package (1). A photodiode (3) is glued with a SnPb solder (82) to the upper surface (50) of the capacitor (2). The bottom of the photodiode is overall a metal electrode (91) which is an n-side electrode made from gold (Au). The n-side electrode is directly soldered to the capacitor (2) with the SnPb (82).

The bottom electrode (52) is allotted to the ground level and the top electrode (50) is assigned to the source voltage. A wire (21) connects the upper surface (50) to the source pin (11).

The photodiode (3) is produced upon an n-type substrate. Any kinds of photodiodes are available for this module. The substrate wafer is a crystal which can be a substrate material of a photodetector, for example, a GaAs wafer, an InP wafer or a Si wafer. The example of FIG. 16 consists of a low resistance n-type substrate (92), a buffer layer (93), a light receiving layer (94) and a window layer (95) which are piled in this order. A dish-shaped p-type region (96) is formed by thermal diffusion of a p-type impurity at the center of the upper surface. A ring-shaped p-side electrode (97) is formed on the periphery of the p-type region (96). The peripheral insulator on the top is a protective layer (99) made from SiN, SiO etc. The central transparent layer is an antireflection layer (98) which is made from multilayers of two materials with different refractive indexes. The annular p-side electrode (97) which is an output of the photodiode (3) is connected with a wire (23) to a preamplifier.

Figure 7:
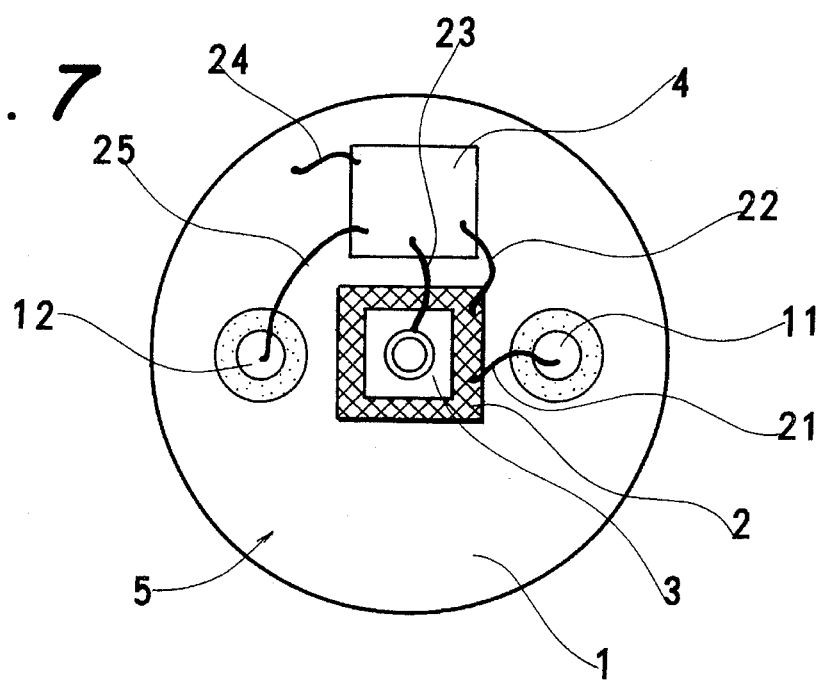
FIG. 7 is a plan view of the package of the embodiment of FIG. 1.

The preamplifier IC (4) is die-bonded at a peripheral point, as shown in FIG. 1 or FIG. 7. These parts are bonded on the package in the order of the parallel plate capacitor (2), the preamplifier IC (4) and the photodiode (3). After the parts have been bonded on the package, the parts, the print patterns and the pins are joined by wirebonding of gold (Au) wires of a 20 μm diameter.

As clearly demonstrated in FIG. 7, five wires (21) to (25) connect five sets ① to ⑤ of pads or pins;
① the source pin (11) and the upper surface of the capacitor (2) by a wire (21),
② the upper surface of the capacitor (2) and the source pad of the preamplifier IC (4) by a wire (22),
③ the signal output pad (anode) of the photodiode (3) and the input pad of the preamplifier (4) by a wire (23),
④ the output pad of the preamplifier IC (4) and the signal output pin (12) of the package (1) by a wire (25), and
⑤ the ground pad of the preamplifier (4) and the package (1) by a wire (24).

A metal cap (7) with a lens (6) is fitted on the package (1) in the atmosphere of dry nitrogen gas. The position of the cap (7) is determined at the spot which maximizes the power of the vertically incident light through the lens (6) into the photodiode (3). Then the cap (7) is welded by the resistor welding at the spot on the package (1). The resistor welding can be replaced by the laser welding. The inner space of the cap is airtightly sealed by the welding.

Then a ferrule-holding sleeve (8) is positioned on the package. The optimum position of the sleeve (8) is determined by inserting a fiber into the sleeve, sending light in the fiber, observing the light power at the photodiode and maximizing the light power. The sleeve (8) is fixed at the optimum point by welding, that is, by the YAG laser welding or the resistor welding. In the example, the sleeve (8) is fixed on the package. Otherwise, the sleeve (8) can be fitted on the cap (7).

Figure 5:
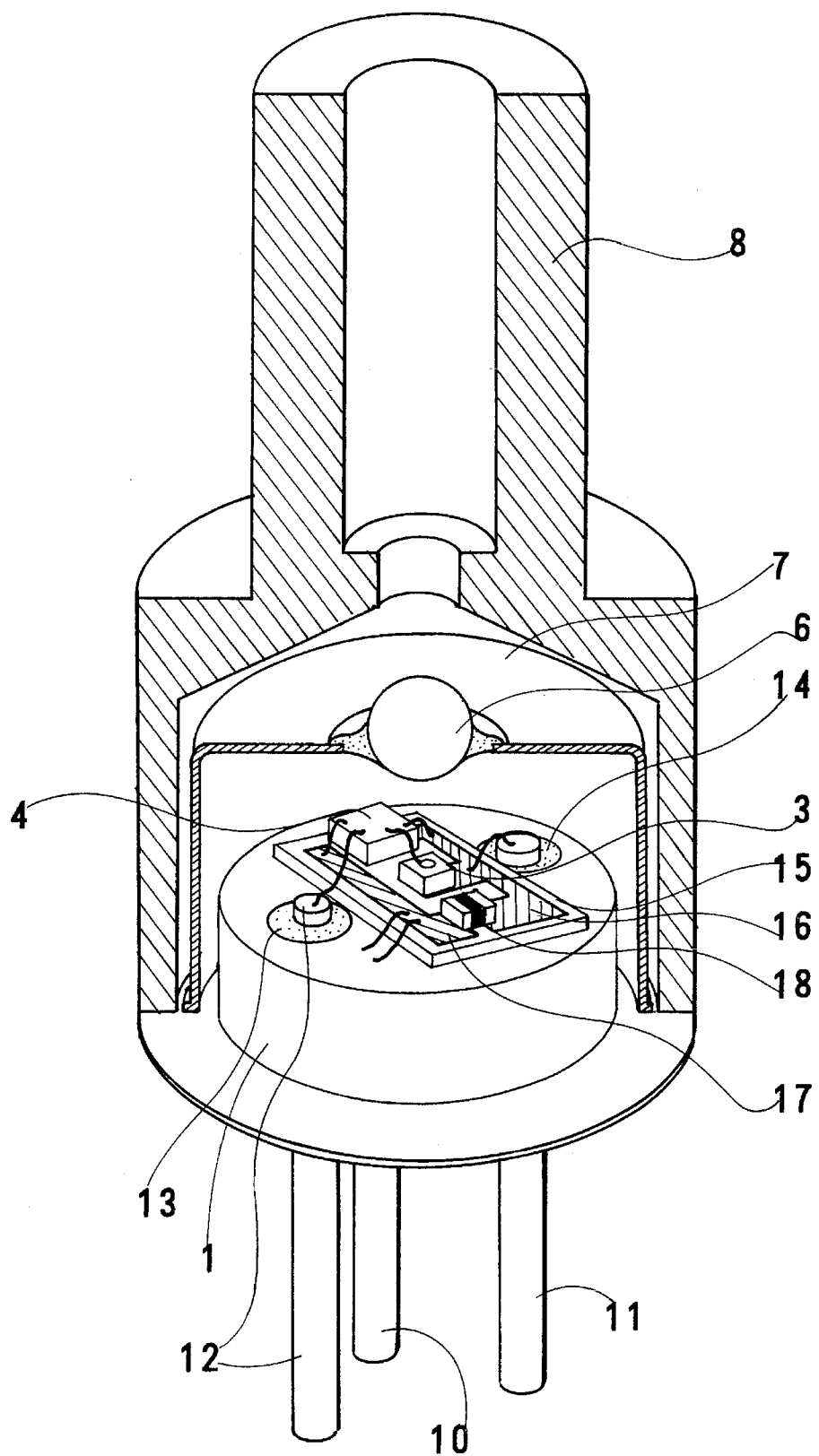
FIG. 5 is a perspective view of a vertical section of a prior photodiode module which is produced by mounting a capacitor, a photodiode and a preamplifier on a special print plate on which a source pattern and a ground pattern have been depicted.
Figure 6:
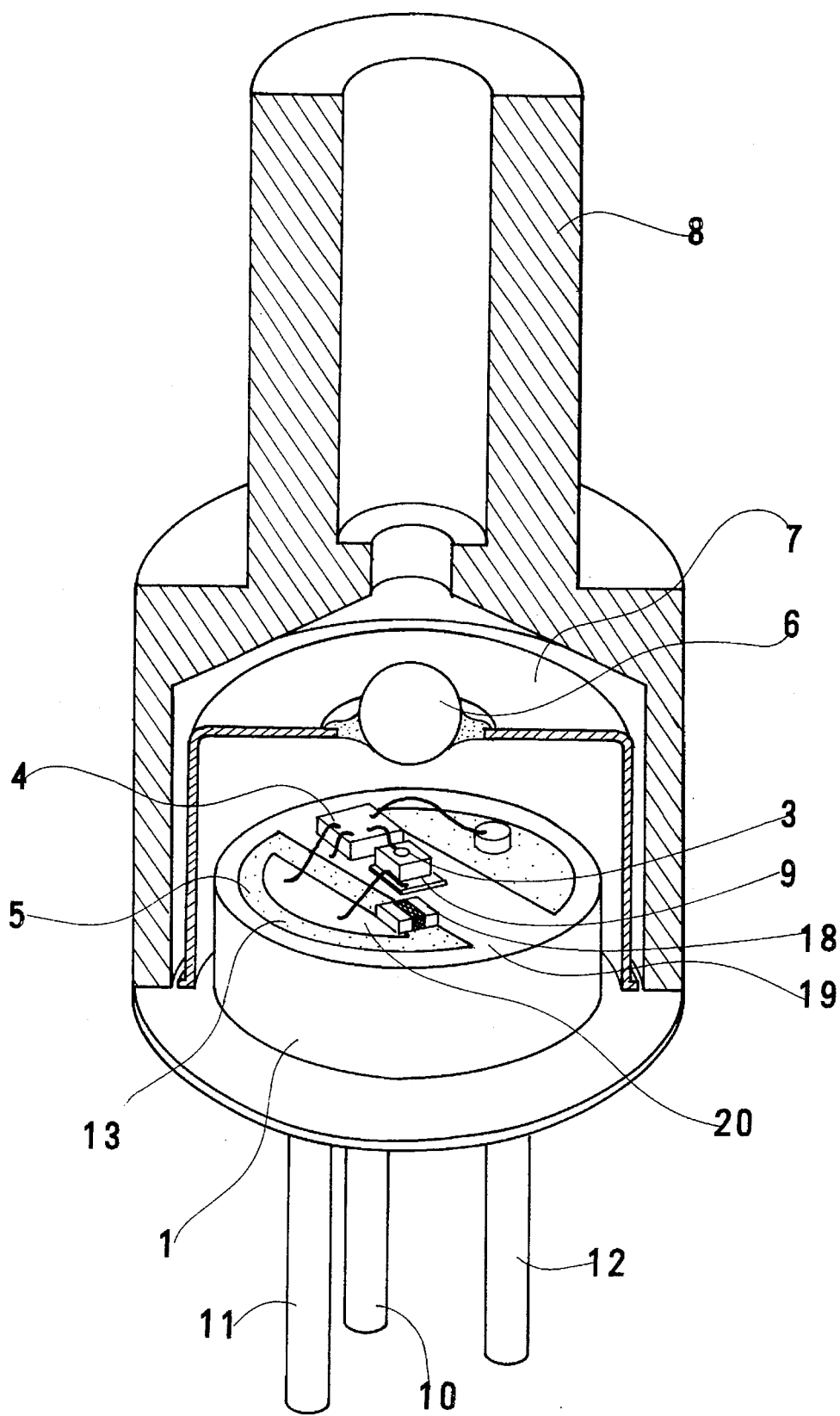
FIG. 6 is a perspective view of a vertical section of another prior photodiode module which unifies a source-pattern pin, a signal output pin and a ground-pattern pin with an insulator to a package.
Figure 8:
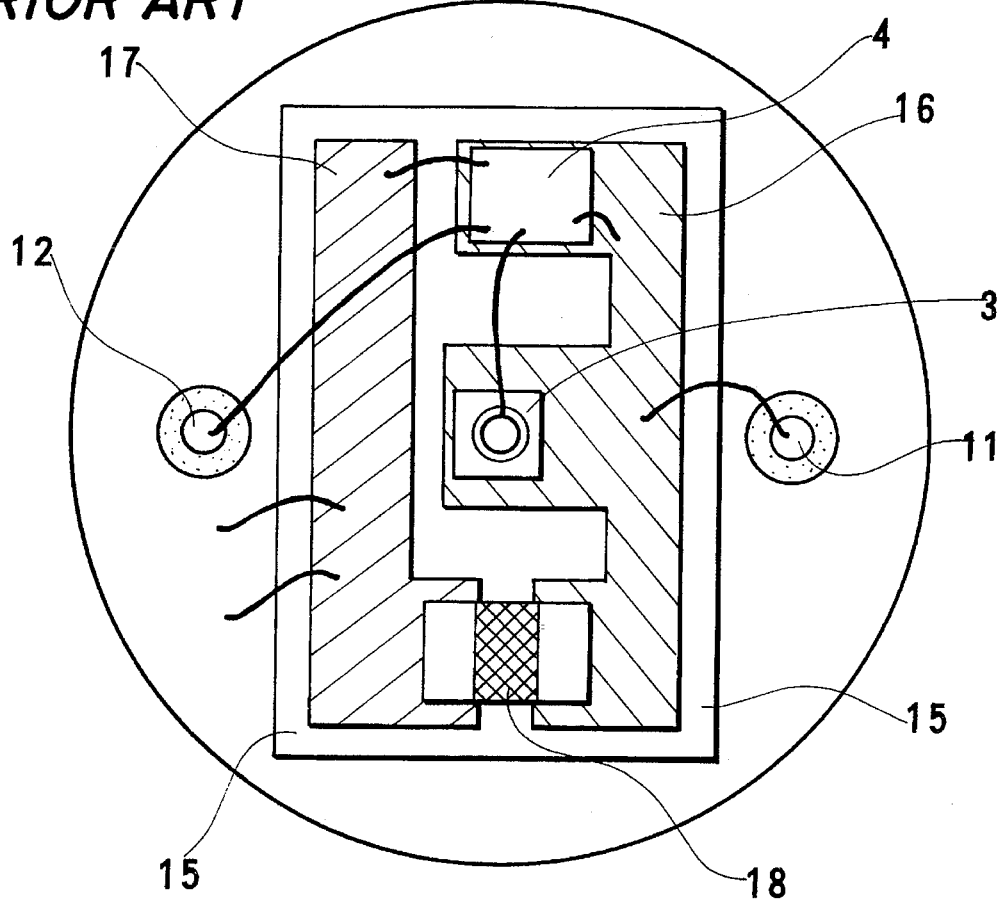
FIG. 8 is a plan view of the package of the prior module of FIG. 5.
Figure 9:
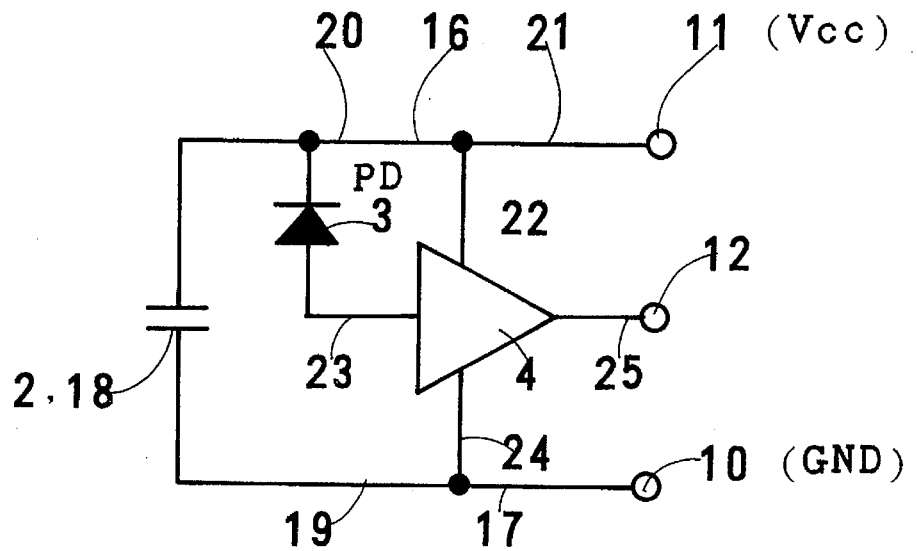
FIG. 9 is a diagram of the electric circuit of the photodetector module of the first embodiment of FIG. 1.

The two-story structure of the PD and the capacitor enables this invention to mount all the necessary parts within the central area of a 3.0 mm diameter on the package (1). This fact allows the device to use a general-purposed package of a 5.6 mm diameter which is far smaller than the single-purposed packages of the prior devices (FIG. 5, FIG. 6 or FIG. 8).

Prior modules were used to mount a capacitor and a photodiode at different spots on a package. The flat structure demanded a wider area than an area of a 4.0 mm diameter for mounting the parts. Thus, prior modules sometimes employed a 10 mm φ package or an 8 mmφ package. The prior structure required at least a 7 mmφ package owing to the flat distribution of the parts.

This invention succeeds in reducing the necessary area for mounting parts of the package. The reduction of the mounting area enables this invention to miniaturize photodiode modules. The two-story mount of the module dispenses with the insulating spacer of the photodiode which electrically insulates the photodiode from the package. The omission of the spacer alleviates the number of the parts and the steps of production.

Figure 15:
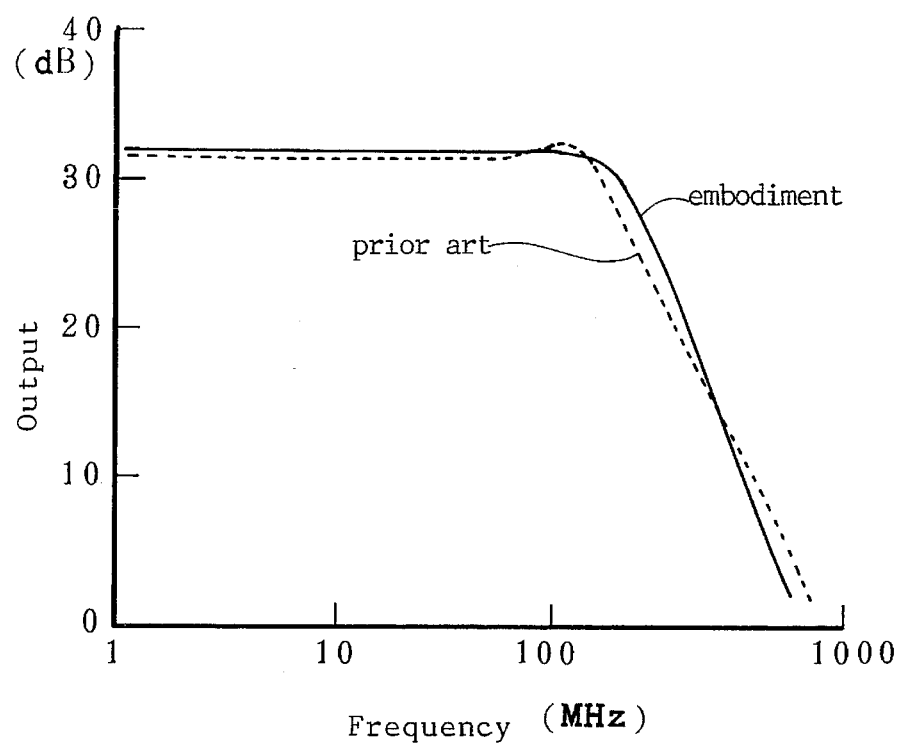
FIG. 15 is a graph showing the frequency performance of the photodiode module of the present invention (solid line) and the prior module (dotted line).

Frequency performance of the photodiode module which is driven by the signal rate of 125 Mbit/s is measured in order to estimate the quality of the photodiode module. FIG. 15 denotes the results. The frequency performance of the prior one is also denoted in the same graph. The solid line shows the result of this invention. The dotted line shows the property of the prior one. The abscissa is the frequency (MHz) of modulation. The ordinate is the output of the signal of the module in a unit of dB. This invention can accomplish a flat response property till more than 150 MHz. The 3-dB attenuation frequency is 200 MHz.

The prior one obtains a flat response property till 90 MHz but suffers from a peaking at 100 MHz. The 3-dB attenuation frequency is 130 MHz. This result exhibits that the module of this invention enjoys more excellent high frequency performance than the prior one.

The above is an embodiment which utilizes the capacitor (2) sandwiched between the package (1) and the photodiode (3) in common both as a bypass capacitor of the photodiode and as a bypass capacitor of the preamplifier. Otherwise, the capacitor can solely be allotted to the bypass capacitor either for the photodiode or the preamplifier.

Figure 2:
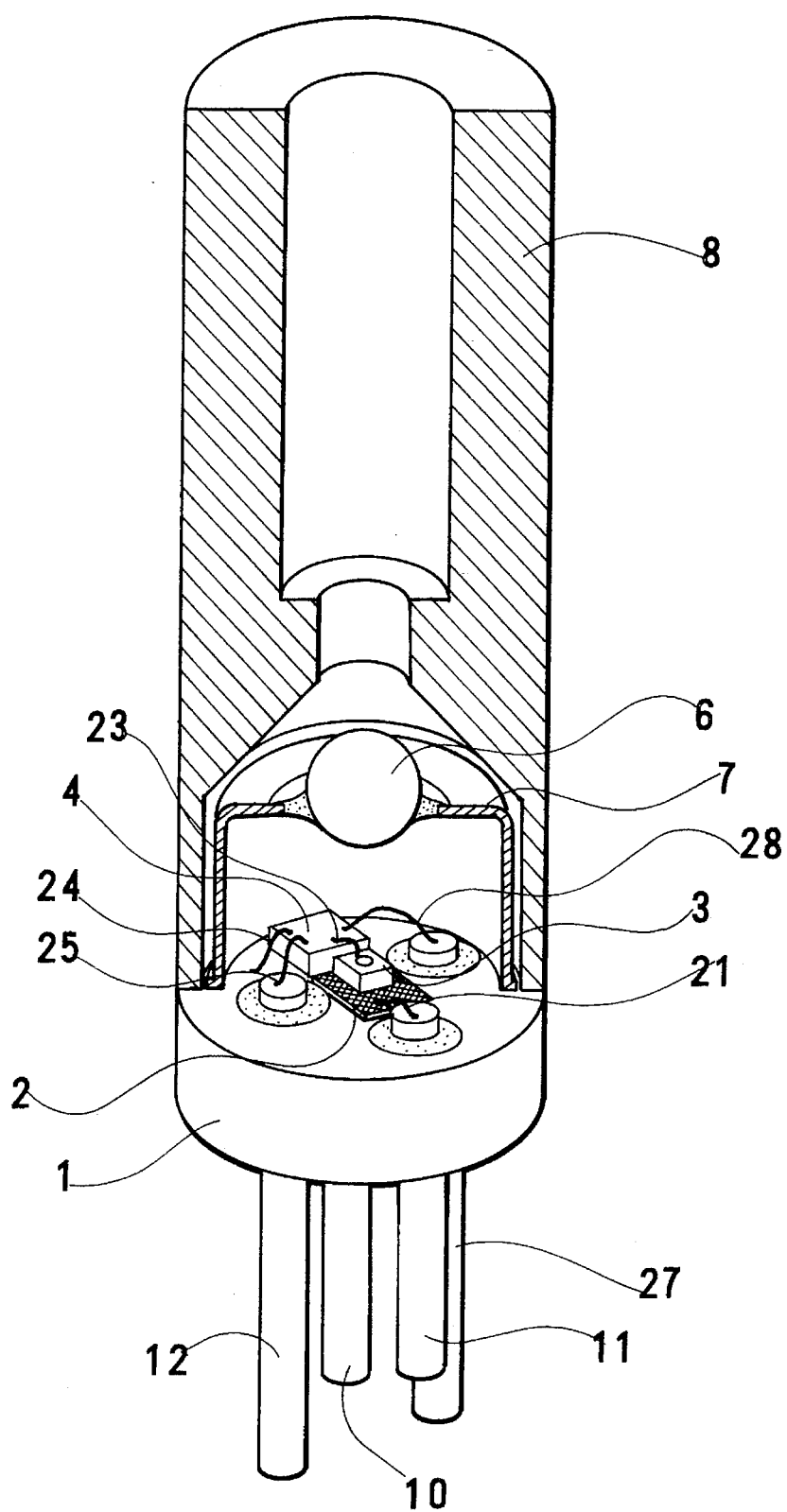
FIG. 2 is a perspective view of a vertical section of a photodiode module of a second embodiment of the present invention.
Figure 3:
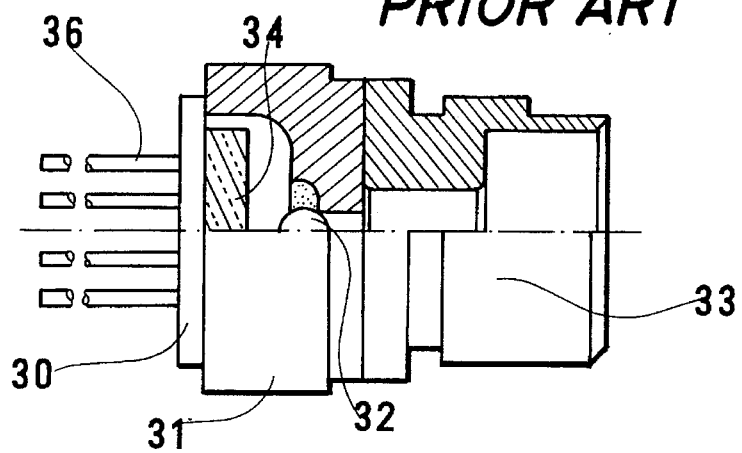
FIG. 3 is a partially sectioned side view of the pre-Amp containing PD module disclosed by Horigome et al., 1990 Spring Conference of Electronics Information Communication Society, the 4th-volume, C271, p4–326(1990).
Figure 4:
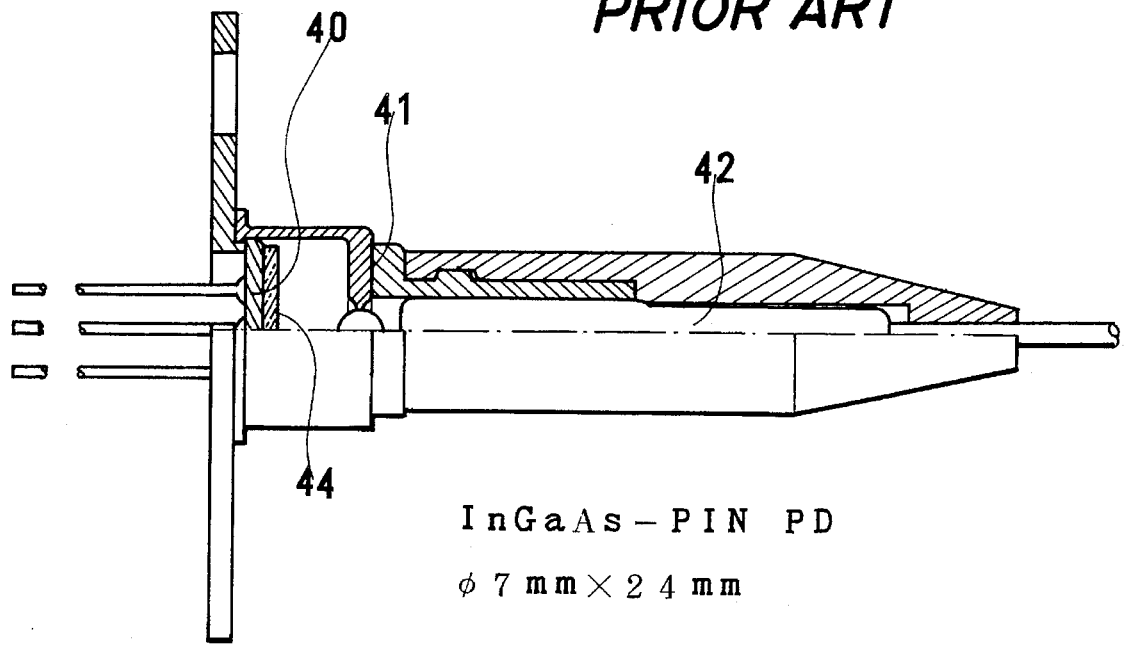
FIG. 4 is a partially sectioned side view of the pre-Amp containing PD module proposed by Sawai et al., 1993 Spring Conference of Electronics Information Communication Society, the 4th-volume, C186, p4–222(1993).
Figure 10:
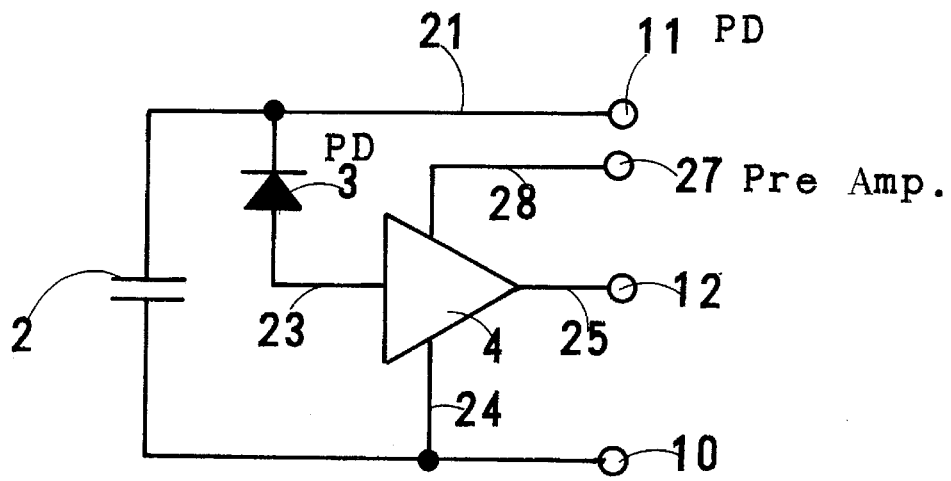
FIG. 10 is a diagram of the electric circuit of the photodiode module of the second embodiment of FIG. 2.

FIG. 2 shows another embodiment which makes use of the capacitor as the bypass capacitor only of a photodiode. Instead of the three-pin package, a four-pin package is employed in the second embodiment for separating the source line of the photodiode from the source line of the preamplifier. Then two independent source pins are prepared in the package respectively to the photodiode (3) and the preamplifier (4). In this case, the parallel plate capacitor (2) is made use of the bypass capacitor solely for the photodiode (3). FIG. 2 is the perspective view of the second embodiment and FIG. 10 is the circuit diagram of the same module.

In FIG. 2, a parallel plate capacitor (2) is soldered by the AuSn solder at the center of the package (1). A photodiode (3) is soldered with the SnPb on the capacitor (2). A preamplifier IC (4) is also soldered at a periphery of the package (1). The bottom of the preamplifier (4) and the bottom of the capacitor (2) are at the ground level, since they are directly bonded on the case (package) which is connected to the ground pin (10). A PD source pin (11) is connected by a wire (21) to the upper surface of the parallel plate capacitor (2). The preamplifier source pin (27) is joined by a wire (28) to a source pad of the preamplifier (4). The source pins (11) and (27) are separated in order to supply the photodiode (3) and the preamplifier (4) with different voltages or different DC impedance. The isolation of the photodiode (3) from the preamplifier (4) is effective to cut the noise or to suppress the parasitic oscillation. These are different points from the former embodiment.

The rest are the same as the first embodiment. An annular electrode (p-side electrode) of the photodiode (3) is coupled by a wire (23) to an input pad of the preamplifier (4). A signal output pad of the preamplifier (4) is joined by a wire (25) to a signal output pin (12). A wire (24) connects a ground pad of the preamplifier (4) to the case (package(1)). An increase of the pin (27) hardly enlarges the size of the package in the four-pin module.

This invention does not restrict the photodiode to an n-type substrate one. A p-type substrate photodiode is also available in the module. In the case of the p-type substrate photodiode, the voltage applied from the source is negative. The polarities of parts are all reverse. The photodiode which has been built on a semi-insulating semiconductor is also applicable, for example, a GaAs photodiode. In this case, no current flows throughout the substrate. Thus, the upper electrode of the capacitor should be joined to the source pad of the photodiode chip. The module does not restrict the driving voltage to 5 V. This invention can be applied to any device of any driving voltage.

Furthermore, this invention is not confined to the 5.6 mmϕ package but can be applied to any sized package with any number of pins. This invention narrows the mounting area on any package and reduces the number of the parts.

The parallel plate capacitor can take various sizes and various shapes in this invention. The wire is not restricted to gold (Au). Cu wires or Al wires can be also utilized to connect the electrodes and pads in the module. The mode of connection of wires is not restricted to the mode shown in FIG. 1 or FIG. 2.

This invention succeeds in miniaturization of a photodiode module and in simplifying the steps of production of a photodiode module by piling a photodiode on a parallel plate capacitor. The difference of the necessary areas will easily be understood by comparing the plan views of the packages. FIG. 7 is the plan view of the package of the present invention. FIG. 8 is the plan view of the package of the prior module of FIG. 5. The comparison verifies the excellence of the present invention.

What we claim is:

1. A photodetector module comprising:

a package having a case pin, a signal output pin and at least one source pin;

a parallel plate capacitor mounted at a central portion of the package;

a photodiode electrically connected to a top of the parallel plate capacitor for receiving optical signals and providing to electric signals responsive thereto;

a preamplifier at a peripheral portion of the package for amplifying the electric signals from the photodiode;

a cap with a lens sealing an upper portion of the package;

a sleeve fitted on the package or on the cap for holding a ferule at an end of an optical fiber; and wires which connect the capacitor, the preamplifier, the photodiode, the package and the pins of the package.

2. A photodetector module as claimed in claim 1, wherein at least one source pin comprises a photodiode source pin and a preamplifier source pin.

3. A method of producing a photodetector module comprising the steps of;

soldering a parallel plate capacitor using a first solder at a central portion of a package having a case pin, a source pin and a signal output pin;

attaching a preamplifier at a peripheral portion of the package, soldering a photodiode on the capacitor using a second solder having a lower melting point than the first solder;

wire-bonding pads of the photodiode, pads of the preamplifier, and an electrode of the capacitor;

positioning a cap with a lens;

fixing the cap on the package;

positioning a sleeve for holding a ferrule at an end of an optical fiber, and;

fixing the sleeve of the package or on the cap.

4. A method as claimed in claim 3, wherein the difference between the melting point Tc1 of the first solder and the melting point Tc2 of the second solder is bigger than 20° C.

5. A method as claimed in claim 4, wherein the first solder is AuSn and the second solder is SnPb.

* * * * *